United States Patent [19]

Stern et al.

[11] Patent Number: 4,988,954
[45] Date of Patent: Jan. 29, 1991

[54] LOW POWER OUTPUT STAGE CIRCUITRY IN AN AMPLIFIER

[75] Inventors: Kenneth J. Stern; Stephen F. Bily, both of Austin, Tex.

[73] Assignee: Crystal Semiconductor Corporation, Austin, Tex.

[21] Appl. No.: 345,320

[22] Filed: Apr. 28, 1989

[51] Int. Cl.⁵ .......................... H03F 3/26; H03F 3/16
[52] U.S. Cl. ................................... 330/264; 330/253; 330/255
[58] Field of Search ................. 330/109, 51, 107, 253, 330/255, 264, 277

[56] References Cited

U.S. PATENT DOCUMENTS

| 3,887,881 | 6/1975 | Hoffmann | 330/35 |
| 4,038,607 | 7/1977 | Schade, Jr. | 330/264 |
| 4,622,482 | 11/1986 | Ganger | 330/264 X |

FOREIGN PATENT DOCUMENTS

| 3138078 | 5/1982 | Fed. Rep. of Germany . |
| 3828546 | 3/1989 | Fed. Rep. of Germany . |

Primary Examiner—Steven Mottola
Attorney, Agent, or Firm—Leonard & Lott

[57] ABSTRACT

A linear power amplifier having differential push-pull outputs, in which each output consists of an upper and a lower output transistor, includes cross-coupling transistors coupled between the gate of each of the output transistors and a reference voltage such that when the cross-coupled transistor is made conductive, it acts to turn off its associated output transistor. Each of the cross-coupled transistors is controlled by the voltage at the gate of the corresponding output transistor at the other of the differential outputs. Thus, the cross-coupling transistors insure that only one of the upper output transistors is on at one time and only one of the lower output transistors is on at any one time. These cross-coupling transistors operate in conjection with output stage shutoff circuitry to control the current wasted in the output stages of the linear power amplifier by ensuring that the output transistors at each output are not both conducting a significant amount of current at any one time. The output stage shutoff circuitry is activated by an external signal which is active when the differential input voltage to the amplifier is zero. During this time the output stage shutoff circuitry isolates the output transistors from the input stages, and forces the output transistors to be nonconductive. The cross-coupled control technique is also applied to single output stages in which cross-coupling transistors cause their respective output transistor to turn off when the other output transistor is conducting significant current.

19 Claims, 4 Drawing Sheets

LOW POWER OUTPUT STAGE CIRCUITRY IN AN AMPLIFIER

TECHNICAL FIELD OF THE INVENTION

The present invention pertains to amplifiers, and, more particularly, to circuits for reducing the amount of current wasted in the output stage of a linear power amplifier.

BACKGROUND OF THE INVENTION

Linear power amplifiers are used extensively in electronic applications to drive electronic signals into low impedance loads. These amplifiers are usually designed with a single-ended output or with differential outputs, depending upon the requirements of a specific application. For example, a telephone transmission line carrying digital data according to a T1 protocol is generally driven by a linear power amplifier having differential outputs due to the large output swings and symmetry required.

The output stage of the linear power amplifier is commonly implemented with a pair of push-pull transistors. In a push-pull configuration, an upper transistor sources current to the load from a positive power supply, and a lower transistor sinks current from the load to a negative power supply. Current which flows directly from the upper transistor and through the lower transistor without flowing through the load, referred to herein as rush-through current, results in wasted power. Most of this power loss occurs during the switching phase when one transistor switches on before the other switches off. On the other extreme, if one transistor switches completely off before the other switches on, the output stage will exhibit an output deadband, which causes cross-over distortion.

In order to minimize cross-over distortion, a certain amount of rush-through current is usually allowed in the output stage to insure that at least one output transistor is on during the switching phase. As such, the output stage operates as a class-AB amplifier. The control of the rush-through current over environmental and processing variations is critical in obtaining low cross-over distortion without incurring a large power penalty. This control becomes even more critical in differential output amplifiers, which have two outputs with twice the potential for wasted power.

Therefore, it can be appreciated that circuitry which effectively controls the rush-through current in a linear power amplifier having push-pull outputs is highly desirable.

SUMMARY OF THE INVENTION

It is, therefore, an object of this invention to provide circuitry for effectively controlling the rush-through current in a linear power amplifier having push-pull outputs.

Shown in an illustrated embodiment of the invention is an amplifier output stage having a positive output and a negative output, wherein the positive output is driven, at least in part, by a first output transistor coupled between a first reference voltage and the positive output, and the negative output is driven, at least in part, by a second output transistor coupled between the first reference voltage and the negative output. The amplifier output stage further includes a first variable current shunt path coupled to a control terminal of the first output transistor, wherein the first variable current shunt path is responsive to the voltage on a control terminal of the second output transistor such that the amount of current through the first variable current shunt path affects the conductivity of the first output transistor; and also includes a second variable current shunt path coupled to the control terminal of the second output transistor, wherein the second variable current shunt path is responsive to the voltage on the control terminal of the first output transistor such that the amount of current through the second variable current shunt path affects the conductivity of the second output transistor. In a further aspect of this illustrated embodiment of the invention, the positive output is also driven by a third output transistor coupled between a second reference voltage and the positive output, and the negative output is also driven by a fourth output transistor coupled between the second reference voltage and the negative output. The amplifier output stage further includes a third variable current shunt path coupled to a control terminal of the third output transistor, wherein the third variable current shunt path is responsive to the voltage on a control terminal of the fourth output transistor such that the amount of current through the third variable current shunt path affects the conductivity of the third output transistor; and also includes a fourth variable current shunt path coupled to the control terminal of the fourth output transistor, wherein the fourth variable current shunt path is responsive to the voltage on the control terminal of the third output transistor such that the amount of current through the fourth variable current shunt path affects the conductivity of the fourth output transistor.

Also shown in an illustrated embodiment of the invention is an amplifier output stage having a positive output and a negative output, wherein the positive output is driven, at least in part, by a first output transistor coupled between a first reference voltage and the positive output, and the negative output is driven, at least in part, by a second output transistor coupled between the first reference voltage and the negative output. The amplifier output stage further includes a first cross-coupling transistor coupled between the first reference voltage and a control terminal of the first output transistor with a control terminal of the first cross-coupling transistor coupled to a control terminal of the second output transistor; and further includes a second cross-coupling transistor coupled between the first reference voltage and the control terminal of the second output transistor with a control terminal of the second cross-coupling transistor coupled to the control terminal of the first output transistor. In a further aspect of this illustrated embodiment of the invention, the positive output is also driven by a third output transistor coupled between a second reference voltage and the positive output, and the negative output is also driven by a fourth output transistor coupled between the second reference voltage and the negative output. The amplifier output stage further includes a third cross-coupling transistor coupled between the second reference voltage and a control terminal of the third output transistor with a control terminal of the third cross-coupling transistor coupled to a control terminal of the fourth output transistor; and further includes a fourth cross-coupling transistor coupled between the second reference voltage and the control terminal of the fourth output transistor with the control terminal of the fourth cross-coupling transistor coupled to the control terminal of the third output transistor.

Further shown in an illustrated embodiment of the invention is an amplifier including an input stage and an output transistor. The output transistor is coupled between a reference voltage and an output terminal, and has a control terminal coupled to the input stage. Circuitry is provided which is coupled between the input stage and the control terminal of the output transistor. In response to a control signal, this circuitry isolates the input stage from the control terminal of the output transistor, and also applies a voltage to the control terminal which renders the output transistor nonconductive.

Also shown in an illustrated embodiment of the invention is an amplifier output stage having a first output transistor coupled between a first reference voltage and an output terminal, and a second output transistor coupled between a second reference voltage and the output terminal. A first variable current shunt path is coupled to a control terminal of the first output transistor. The first variable current shunt path is responsive to the voltage on a control terminal of the second output transistor such that the amount of current through the first variable current shunt path affects the conductivity of the first output transistor. In a further aspect of this illustrated embodiment of the invention, the amplifier output stage also includes a second variable current shunt path coupled to the control terminal of the second output transistor. The second variable current shunt path is responsive to the voltage on the control terminal of the first output transistor such that the amount of current through the second variable current shunt path affects the conductivity of the second output transistor.

Additionally shown in an illustrated embodiment of the invention is an amplifier output stage having a first output transistor coupled between a first reference voltage and an output terminal, and a second output transistor coupled between the output terminal and a second reference voltage. The amplifier output stage also includes a first transistor coupled between the first reference voltage and a control terminal of the first output transistor. A second transistor is coupled between the first reference voltage and a first node with a control terminal of the first transistor coupled to a control terminal of the second transistor and also to the first node. A third transistor is coupled between the first node and the second reference voltage with a control terminal of the third transistor coupled to a control terminal of the second output transistor. In a further aspect of this illustrated embodiment of the invention, a fourth transistor is coupled between the control terminal of the second output transistor and the second reference voltage. A fifth transistor is coupled between the second reference voltage and a second node with a control terminal of the fourth transistor coupled to a control terminal of the fifth transistor and also to the second node. A sixth transistor is coupled between the second node and the first reference voltage with a control terminal of the sixth transistor coupled to the control terminal of the first output transistor.

BRIEF DESCRIPTION OF THE DRAWINGS

The aforementioned and other features, characteristics, advantages, and the invention in general, will be better understood from the following, more detailed description taken in conjunction with the accompanying drawings in which.

Figure 1:
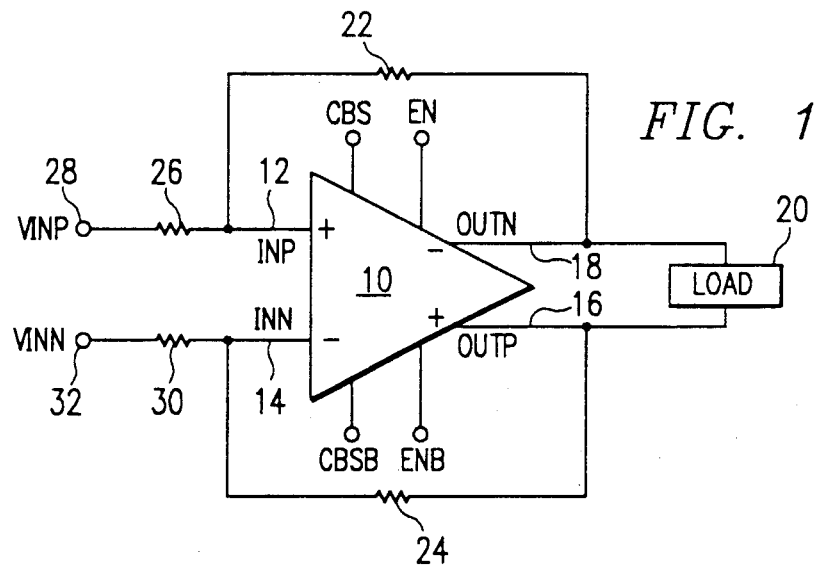
FIG. 1 is a simplified block diagram of a linear power amplifier according to the present invention with feedback resistors.

It will be appreciated that for purposes of clarity and where deemed appropriate, reference numerals have been repeated in the figures to indicate corresponding features.

DESCRIPTION OF THE PREFERRED EMBODIMENT

A linear power amplifier according to the preferred embodiment of the present invention has positive and negative inputs and positive and negative outputs in which the positive input is connected through a resistor to the negative output of the amplifier and also through another resistor to a first input terminal, and similarly, the negative input is connected through a resistor to the positive output and also through another resistor to a second input terminal, such that the differential signal appearing between the first and second input terminals forces the linear power amplifier to drive a load connected between the two output terminals.

Each of the outputs of the amplifier is driven by an output stage which consists of an upper p-channel output transistor connected between a positive supply voltage and the output terminal, and a lower n-channel output transistor connected between the output terminal and a negative supply voltage, which can be ground in certain applications. Connected between the gate of each upper p-channel output transistor and the positive supply voltage is an additional p-channel transistor, the gate of which is connected to the gate of the other upper p-channel output transistor. Similarly, connected between the gate of each lower n-channel output transistor and the negative supply voltage is an additional n-channel transistor, the gate of which is connected to the gate of the other lower n-channel output transistor. These additional p-channel transistors and n-channel transistors, when conductive, tend to turn off their associated output transistors. Therefore, when the upper p-channel output transistor or lower n-channel output transistor of one output has sufficient gate drive to make the transistor at least partially conductive, then the respective additional p-channel transistor or n-channel transistor associated with the other output terminal will also be partially conductive and will help to hold off the associated upper p-channel output transistor or lower n-channel output transistor of the other output.

Although the rush-through current, which is to be controlled, passes from the upper p-channel output transistor to the lower n-channel output transistor at each output, and the described cross-coupling of the additional p-channel transistors and n-channel transistors directly controls only the simultaneity of the upper p-channel output transistors or the lower n-channel output transistors, the presence of a nonzero differential voltage at the output of the amplifier forces the operation of the additional p-channel transistors and the additional n-channel transistors to attenuate the rush-through current through each of the respective output stages.

The preferred embodiment of the power amplifier also includes isolation and shutoff circuitry which is coupled to the gates of the output transistors. This circuitry, in response to an external command to the power amplifier, isolates the output transistors from the input stage, and also pulls the gates of the output transistors toward VCC or ground to make the output transistors nonconductive. This pull-up and pull-down occurs at a controlled rate such that the output transistors, which are conducting at the time the isolation circuitry is enabled, provide a decreasing voltage to the load at a predetermined rate. The isolation and shutoff circuitry addresses potential output stage power loss during the transmission of a zero differential voltage. Although the cross-coupling transistors effectively control rush-through current at nonzero differential output voltages, they provide no control at their trip point which occurs at zero differential voltage. The isolation and shutoff circuitry is enabled just prior to the transmission of a zero differential voltage, causing the output transistors to turn off at a controlled rate, and thus advantageously guaranteeing that power is not wasted in the output stages during that time.

Turning now to the drawings, a linear power amplifier 10, according to the preferred embodiment of the present invention, is shown in FIG. 1. The amplifier 10 has two analog inputs, a positive input 12, shown as INP, and a negative input 14, shown as INN; and four logical inputs, EN, ENB, CBS, and CBSB, the operation of which is described below with reference to FIG. 3. The amplifier 10 also has two outputs, a positive output 16, shown as OUTP, and a negative output 18, shown as OUTN in the drawings. Coupled between the positive output 16 and negative output 18 is a load 20. Connected between the negative output 18 and the positive input 12 is a first feedback resistor 22, and similarly connected between the positive output 16 and the negative input 14 is a second feedback resistor 24. Also connected to the positive input 12 is another resistor 26, the other end of which is connected to a first input terminal 28, shown as VINP in FIG. 1. Similarly, the negative input 14 is connected through a resistor 30 to another input terminal 32, shown as VINN in FIG. 1.

In operation, the amplifier 10 has a large differential voltage gain. The negative differential feedback imposed by resistors 22, 24, 26, and 30 forces the overall closed-loop voltage gain to be set by resistor ratios. The closed-loop amplifier of FIG. 1 is used to drive specific voltage waveforms across a low impedance load. As a result, amplifier 10 is designed to have a large output current capability.

Figure 2:
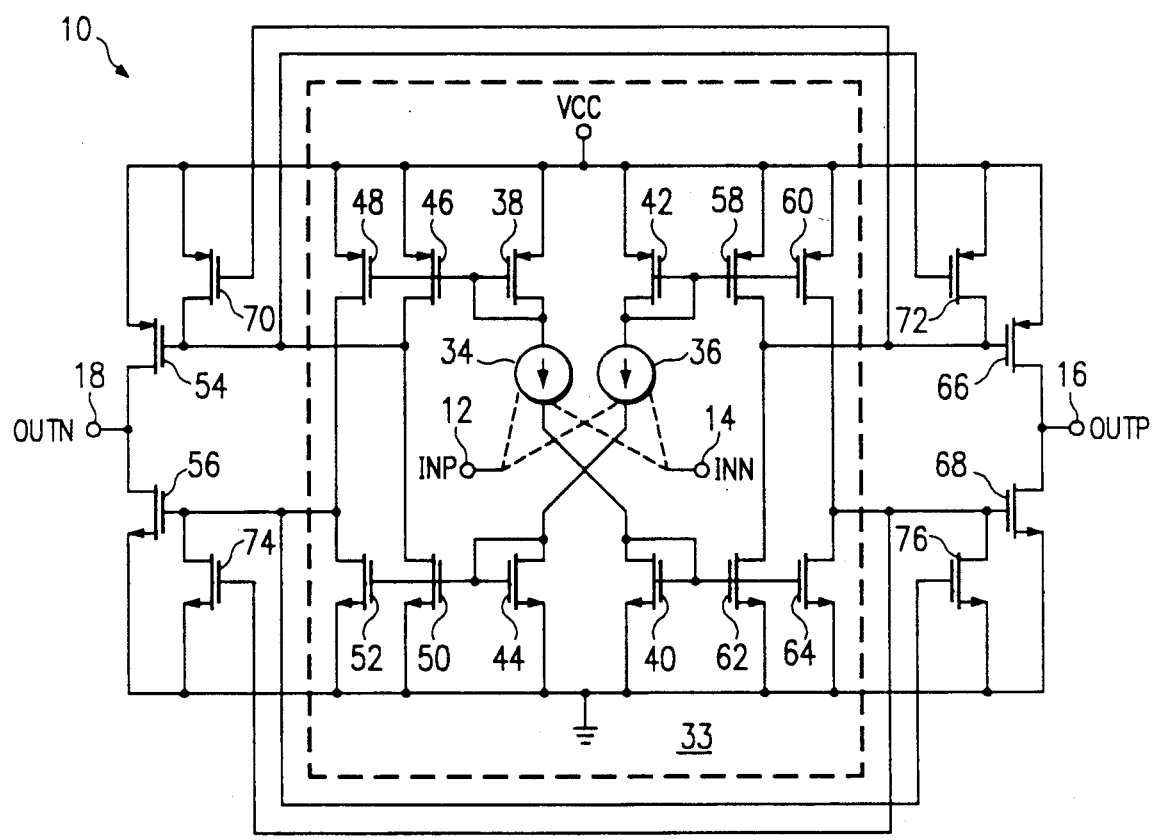
FIG. 2 is a simplified schematic diagram of a linear power amplifier according to the present invention.

Turning now to FIG. 2, a simplified circuit diagram of the amplifier 10 is shown. The amplifier 10 includes a class-AB, high slew current, input stage 33. The input stage 33 has two current sources, a first current source 34, which is controlled by the voltage at the positive input terminal 12 minus the voltage at the negative input terminal 14, and a second current source 36, which is controlled by the voltage at the negative input terminal 14 minus the voltage at the positive input terminal 12. Connected between the current source 34 and the positive supply voltage VCC is a p-channel transistor 38, having its source connected to VCC and its gate and drain connected together and to the current source 34. Connected to the other side of the current source 34 is an n-channel transistor 40, the source of which is connected to the negative supply voltage, shown as ground in FIG. 2, and the drain and gate of which are connected together and to the current source 34. Similarly, connected between the current source 36 and VCC is another p-channel transistor 42, the source of which is connected to VCC and the gate of which is connected to its drain and to the current source 36. Connected to the other side of the current source 36 is another n-channel transistor 44, the source of which is connected to ground and the gate of which is connected to its drain and to the current source 36.

Also in the input stage, the gate of the p-channel transistor 38 is connected to the gates of two additional p-channel transistors 46 and 48. The sources of the p-channel transistors 46 and 48 are connected to VCC. The drain of the p-channel transistor 46 is connected to the drain of an n-channel transistor 50, while the drain of the p-channel transistor 48 is connected to the drain of another n-channel transistor 52. The sources of the n-channel transistors 50 and 52 are connected to ground and their gates are connected to the gate of the n-channel transistor 44. In addition, the gate of the p-channel transistor 42 is connected to the gates of two additional p-channel transistors 58 and 60. The sources of the p-channel transistors 58 and 60 are connected to VCC. The drain of the p-channel transistor 58 is connected to the drain of another n-channel transistor 62, and the drain of the p-channel transistor 60 is connected to the drain of another n-channel transistor 64. The sources of the n-channel transistors 62 and 64 are connected to ground and their gates are connected to the gate of the n-channel transistor 40.

The output stage in FIG. 2 includes four output transistors 54, 56, 66, and 68. The gate of the upper p-channel output transistor 54 is connected to the drain of the p-channel transistor 46, and the gate of the lower n-channel output transistor 56 is connected to the drain of the p-channel transistor 48. The source of the upper p-channel output transistor 54 is connected to VCC and its drain is connected to the negative output 18 of the amplifier 10. The source of the lower n-channel output transistor 56 is connected to ground and its drain is connected to the negative output 18. Likewise, the gate of the upper p-channel output transistor 66 is connected to the drain of the p-channel transistor 58, and the gate of the lower n-channel output transistor 68 is connected to the drain of the p-channel transistor 60. The source of the upper p-channel output transistor 66 is connected to VCC and its drain is connected to the positive output 16 of the amplifier 10. The source of the lower n-channel output transistor 68 is connected to ground and its drain is connected to the positive output 16. Thus, the transistors 54 and 56 and the transistors 66 and 68 form the output stages of the amplifier 10 which are driven by the input stage 33.

Also shown in the output stage in FIG. 2 are four cross-coupling transistors 70, 72, 74, and 76. The cross-coupling transistor 70 is a p-channel transistor having its source connected to VCC, its drain connected to the gate of the upper p-channel output transistor 54, and its gate connected to the gate of the upper p-channel output transistor 66. The cross-coupling transistor 72 is also a p-channel transistor having its source connected to VCC, its drain connected to the gate of the upper p- channel output transistor 66, and its gate connected to the gate of the upper p-channel output transistor 54. The cross-coupling transistor 74 is an n-channel transistor having its source connected to ground, its drain connected to the gate of the lower n-channel output transistor 56, and its gate connected to the gate of the lower n-channel output transistor 68. The cross-coupling transistor 76 is also an n-channel transistor having its source connected to ground, its drain connected to the gate of the lower n-channel output transistor 68, and its gate connected to the gate of the lower n-channel output transistor 56.

In operation, the amplifier 10 of FIG. 2 senses the voltages on the input terminals 12 and 14 which control the magnitude of current flowing through the current sources 34 and 36. When the currents through the current sources 34 and 36 are equal, the currents through transistors 38, 40, 42, and 44 will also be equal. The current through the p-channel transistor 38 is mirrored by the p-channel transistors 46 and 48; the current through the p-channel transistor 42 is mirrored by the p-channel transistors 58 and 60; the current through the n-channel transistor 44 is mirrored by the n-channel transistors 50 and 52; and the current through the n-channel transistor 40 is mirrored by the n-channel transistors 62 and 64. Under these balanced current conditions the voltage potential on the gates of the upper p-channel output transistors 54 and 66 will be equal, and the voltage potential on the gates of the lower n-channel output transistors 56 and 68 will also be equal. The characteristics of the transistors in amplifier 10 are chosen such that under these conditions, the output transistors 54, 56, 66, and 68 will be nonconducting, but on the verge of becoming conductive for any small increase in their gate-to-source voltage.

When the differential input voltage across inputs 12 and 14 becomes more positive, for example, the current source 34 starts conducting more current and the current source 36 starts conducting less current. The increase in current in current source 34 increases the current through the p-channel transistor 38 and the n-channel transistor 40. This increase in current tries to be mirrored by the p-channel transistors 46 and 48 and the n-channel transistors 62 and 64. Stated another way, the currents mirrored by the p-channel transistors 46 and 48 and the n-channel transistors 62 and 64 have an upper limit which is proportional to the current through the p-channel transistor 38 and the n-channel transistor 40. Similarly, the decrease in current source 36 decreases the current through the p-channel transistor 42 and the n-channel transistor 44. This decrease in current is mirrored by the p-channel transistors 58 and 60 and the n-channel transistors 50 and 52. Under these unbalanced current conditions, the drains of the p-channel transistors 46 and 48 become more positive, thereby turning off harder the upper p-channel output transistor 54 and turning on the lower n-channel output transistor 56. Similarly, the drains of the n-channel transistors 62 and 64 become more negative, thereby turning on the upper p-channel output transistor 66 and turning off harder the lower n-channel output transistor 68.

Meanwhile, when the currents through the current sources 34 and 36 are equal, the four cross-coupling transistors 70, 72, 74, and 76 will be nonconducting, but on the verge of being conductive for any small increase in gate-to-source voltage. In the example in the preceding paragraph, as the differential voltage across inputs 12 and 14 becomes more positive and the drains of the p-channel transistors 46 and 48 become more positive, the p-channel cross-coupling transistor 72 will turn off harder, thereby allowing the upper p-channel output transistor 66 to become conductive. Also, the n-channel cross-coupling transistor 76 will become conductive, which will further help to turn off the lower n-channel output transistor 68. In addition, as the differential voltage across inputs 12 and 14 becomes more positive and the drains of the n-channel transistors 62 and 64 become more negative, the p-channel cross-coupling transistor 70 will become conductive, which will further turn off the upper p-channel output transistor 54. Also, the n-channel cross-coupling transistor 74 will turn off harder, thus allowing the lower n-channel output transistor 56 to become conductive. The cross-coupling transistors 70–76 therefore operate to insure that one of the p-channel output transistors 54 or 66 and one of the n-channel output transistors 56 or 68 is held off, or made nonconductive, when the corresponding output transistor at the other output 16 or 18 is made conductive.

Stated another way, the cross-coupling transistors 70–76 operate as current shunts when they are conducting. The current mirror transistors 46–52 and 58–64 are not able to turn on their respective output transistor 54, 56, 66, or 68 until they have supplied enough current to overcome the current sinking capabilities of these cross-coupling transistors 70–76. For example, for the voltage at the drain of the p-channel transistor 48 to rise above the threshold voltage of the n-channel output transistor 56, the current supplied by the p-channel transistor 48 must be greater than the current being sunk by the n-channel transistor 52 and the n-channel cross-coupling transistor 74. The current being sunk by the n-channel cross-coupling transistor 74 is determined by its gate voltage which is the same as the gate voltage of the lower n-channel output transistor 68. Thus, if the gate voltage of the lower n-channel output transistor 68 is sufficient to make the output transistor 68 conductive, then the n-channel cross-coupling transistor 74 will also be conductive and will pull the gate of the lower n-channel output transistor 56 to below its threshold voltage and therefore keep it from becoming conductive.

The cross-coupling transistor 74 can also be viewed as being one of a current mirror transistor pair in which the second transistor is the lower n-channel output transistor 68 since the gates of these two transistors are connected together and their sources are connected to the same reference voltage. Thus, the current through the cross-coupling transistor 74 is proportional to the current through the lower n-channel output transistor 68. Similarly, the cross-coupling transistor 76 and the lower n-channel output transistor 56, the cross-coupling transistor 70 and the upper p-channel output transistor 66, and the cross-coupling transistor 72 and the upper p-channel output transistor 54, can also be viewed as current mirror transistor pairs.

Although the rush-through current passes from the upper p-channel output transistors 54 and 66 directly to their corresponding n-channel output transistors 56 and 68 respectively, the described operation of the cross-coupling transistors 70–76 directly controls only the simultaneity of the upper p-channel output transistors 54 and 66, or the lower n-channel output transistors 56 and 68. A nonzero differential voltage across the outputs 16 and 18, however, causes the operation of the cross-coupling transistors 70–76 to attenuate the rush-through current through each of the respective output stages.

It will be appreciated by those skilled in the art that the relative size of the output transistors and the cross-coupling transistors represents a tradeoff between rush-through current and crossover distortion. For class-AB output stage operation, the cross-coupling transistors are sized large enough to minimize the amount of rush-through current in the output stages yet small enough to avoid excessive output deadband, which causes crossover distortion.

Figure 3:
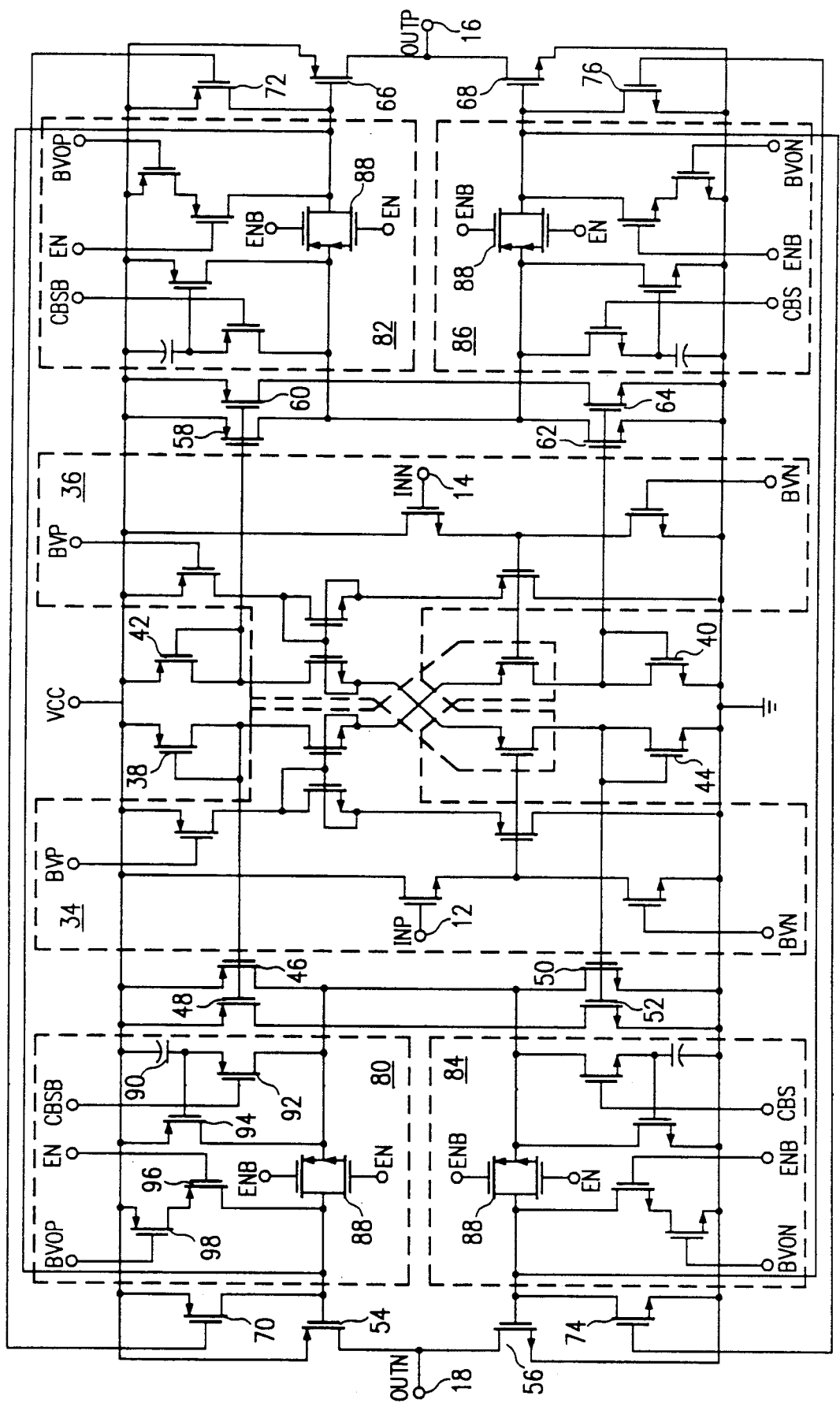
FIG. 3 is a detailed schematic diagram of a linear power amplifier according to the present invention.

A detailed circuit diagram of the linear power amplifier 10 is shown in FIG. 3. The current sources 34 and 36 are shown within the dotted outlined areas indicated in FIG. 3 and consist of circuitry which is known to those skilled in the art. The bias voltages, BVOP, BVON, BVP and BVN, are supplied by circuitry shown in FIGS. 5a and 5b. The circuit shown in FIG. 3 also differs from the circuit shown in FIG. 2 in that interposed between the gates of each of the output transistors and the drains of their respective current mirror driving transistors are additional circuit networks shown within the dashed lines 80, 82, 84, and 86. In particular the network 80 is disposed between the gate of the upper p-channel output transistor 54 and the drain of the p-channel transistor 46. The network 82 is disposed between the gate of the upper p-channel output transistor 66 and the drain of the p-channel transistor 58. The network 84 is disposed between the gate of the lower n-channel output transistor 56 and the drain of the n-channel transistor 52. The network 86 is disposed between the gate of the lower n-channel output transistor 68 and the drain of the n-channel transistor 64.

The networks 80-86 are essentially the same and include a transmission gate 88 disposed between the gate of the respective output transistor and the drain of the respective driving transistor. The network 80 also includes a series combination of a capacitor 90 and a p-channel transistor 92 coupled between the drain of the driving transistor 46 and VCC, the gate of the p-channel transistor 92 being connected to a logic signal CBSB; a p-channel transistor 94 coupled between the drain of the driving transistor 46 and VCC, the gate of which is connected to the common node between the capacitor 90 and the p-channel transistor 92; and the series combination of two p-channel transistors 96 and 98 connected between the gate of the upper p-channel output transistor 54 and VCC, the gate of the p-channel transistor 96 being driven by a logic signal EN, and the gate of the p-channel transistor 98 being driven by a bias voltage, BVOP. As shown in FIG. 3, the network 82 is identical to the network 80, and the networks 84 and 86 are identical to the networks 80 and 82 except that n-channel transistors are used in place of the p-channel transistors, CBS is used in place of CBSB, ENB is used in place of EN, and BVON is used in place of BVOP.

Figure 4:
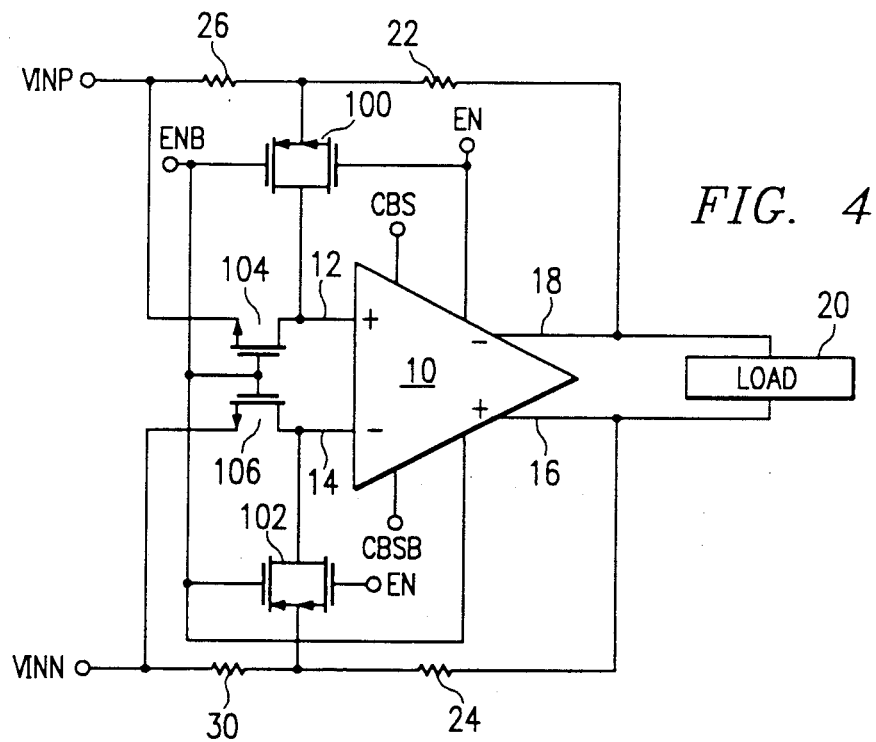
FIG. 4 is a detailed block diagram of a linear power amplifier according to the present invention.

The networks 80-86 are used in combination with additional switching circuitry shown in FIG. 4 consisting of two more transmission gates 100 and 102, each connected between the common nodes of the resistors 22 and 26, and 24 and 30, respectively, and the plus and minus inputs 12 and 14 of the linear power amplifier 10, respectively. In addition, each of the plus and minus inputs 12 and 14 of the power amplifier 10 is connected to the respective input voltages VINP and VINN through an n-channel transistor 104 and 106, respectively.

The preferred embodiment of the present invention has been designed to drive pulses onto a transmission line according to a T1 protocol. In normal operation, when the power amplifier 10 is receiving signal voltages on the input terminals VINP and VINN and driving pulses on the line, the n-channel transistors 104 and 106 are nonconductive and the transmission gates 100 and 102 are conductive, and in the power amplifier 10, the transmission gates 88 are conductive, and the transistors 96 and 92 are nonconductive. These conditions place the amplifier in a closed-loop configuration with differential feedback produced by resistors 22, 24, 26, and 30, shown in FIG. 1. In this configuration, the cross-coupling transistors 70-76 effectively limit rush-through current since the outputs of the amplifier 10 are not maintained at zero differential voltage.

When a zero differential output voltage is to be sent down the transmission line, the power amplifier 10 is placed in an open-loop, bias-refresh mode. In this mode, the input signals VINP and VINN are set to a differential zero voltage, and the n-channel transistors 104 and 106 are made conductive while the transmission gates 100 and 102 are made nonconductive, thereby forcing the differential zero voltage onto the positive and negative inputs 12 and 14 of the power amplifier 10. At the same time, the transmission gates 88 are made nonconductive, the transistors 96 are enabled by EN or ENB, as appropriate, and the gates of the upper p-channel output transistors 54 and 66 are pulled toward VCC through the transistors 98. Similarly, the gates of the n-channel output transistors 56 and 68 are pulled toward ground through the n-channel transistors corresponding to the p-channel transistor 98. The value of the bias voltages BVOP and BVON and size of the p-channel transistor 98 and its counterparts are selected such that the output of the linear power amplifier 10 will have the desired slope during the trailing edge of the pulse.

Also at this time, the output stage biasing is refreshed. The transistor 92 and its corresponding transistors are made conductive by CBS or CBSB, as appropriate, to cause the transistor 94 and its corresponding transistors to act as diodes. During this time, since the input stage is nominally balanced, the current transistors 46-52 and 58-64 tend to have the same current. Without the additional networks, 80-86, the voltage at the drains of these current transistors would be determined only by the output conductance of the current transistors, and could be such that large rush-through currents would exist in the output stages. The transistor 94 and its counterparts, when diode connected, sink the bias current necessary to force their drains near one threshold voltage. This current includes an amount to overcome the output conductance effects of the current transistors 46-52 and 58-64, and an additional amount to counteract offset currents created by mismatches in the input stage of the amplifier.

When the linear power amplifier 10 returns to normal operation, the voltage stored on the capacitor 90 and its counterparts causes transistor 94 and its counterparts to provide a fixed bias current such that all of the output transistors 54, 56, 66, and 68 are biased at their cutoff points. Thus, any drive immediately shuts off or turns on the respective output transistors. In this manner, the dynamic biasing of the capacitor 90 and its counterparts roughly controls the rush-through current and crossover distortion in the output stages.

The additional networks 80-86, therefore, serve three functions. First they isolate the output stage from the input stage to allow output stage shutoff and bias refreshing when a zero output is transmitted. Second, they shut off the output transistors in a controlled fashion to eliminate potential rush-through current at zero differential output voltages. Finally, they provide dynamic bias currents to bias the output stage roughly in a class-AB mode. These networks, in conjunction with the cross-coupling transistors 70-76, control rush-through current over all modes of the amplifier.

Figure 5A:
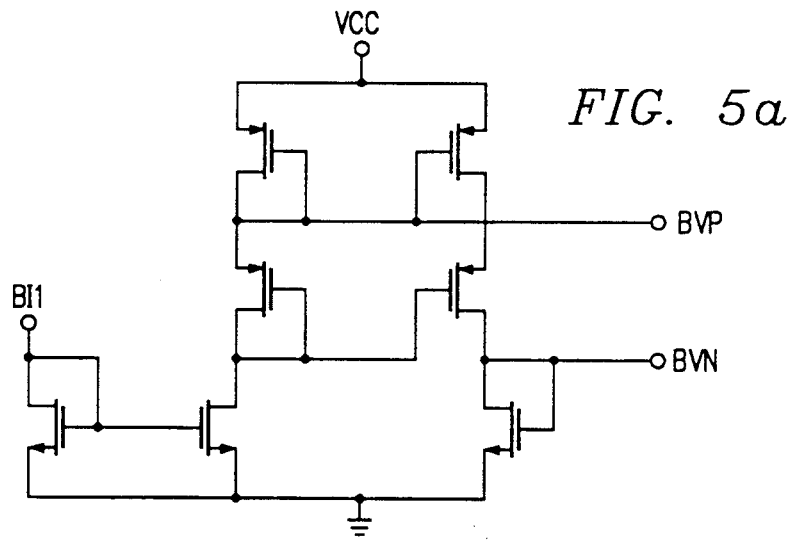
FIGS. 5a and 5b are circuit diagrams of bias voltage generator circuits used to provide the bias voltages shown in FIG. 3.

FIG. 5a is a schematic diagram of the circuit used to generate the bias voltages BVP and BVN used in FIG. 3. The input current BI1 is chosen to supply the desired bias voltages BVP and BVN which produce the proper bias currents in the amplifier.

Figure 5B:
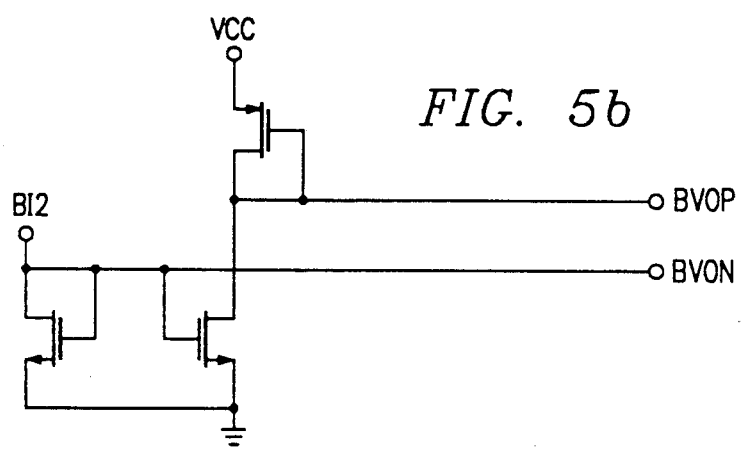

FIG. 5b is a schematic diagram of the circuit used to generate the bias voltages BVOP and BVON used in FIG. 3. The input current BI2 is chosen to supply the desired bias voltages BVOP and BVON which produce the proper slope on the pulse tails described above. The bias voltages produced by circuits shown in FIGS. 5a and 5b are DC voltages in the preferred embodiment. However, it is within the scope of the present invention for the BI2 current to be time varying in order to produce a different pulse tail voltage waveform than that produced with a DC BI2 input current.

Figure 6:
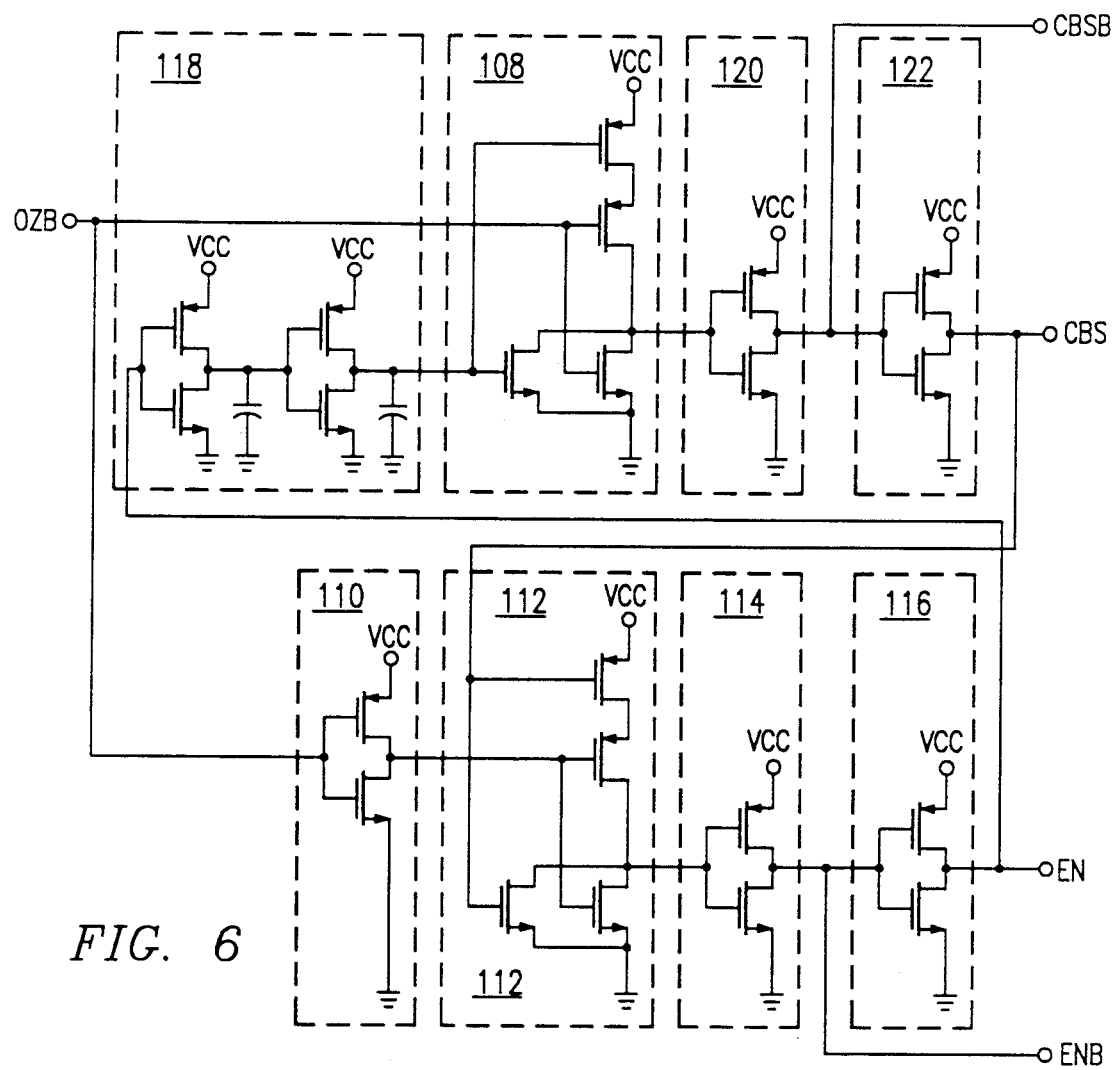
FIG. 6 is a circuit diagram of a switching circuit used to provide the logic signals shown in FIG. 3.

FIG. 6 is a schematic diagram of the circuitry used to generate the logic voltages used in FIG. 3 and FIG. 4. The input signal, output zero bar, shown as OZB in FIG. 6, is high or logic level 1 during normal operation of the linear power amplifier 10, and low or logic level 0 during the time that the linear power amplifier 10 is placing a zero on the line and refreshing the biasing voltages on the capacitors 90. The OZB signal is connected to one input of a NOR gate 108 and to the input of an inverter 110. The output of the inverter 110 is connected to one input of another NOR gate 112, the output of which is connected to the input of another inverter 114. The output of the inverter 114 forms the signal ENB and is also connected to the input of another inverter 116. The output of the inverter 116 forms the signal EN and is also connected to the input of a delay circuit 118. The output of the delay circuit 118 is connected to the second input of the NOR gate 108, the output of which is connected to the input of another inverter 120. The output of the inverter 120 forms the signal CBSB and is also connected to the input of another inverter 122. The output of the inverter 122 forms the signal CBS and is also connected to a second input of the NOR gate 112.

In operation, when the OZB signal goes low to force the output of the linear power amplifier 10 to zero, the ENB output goes high and the EN output goes low. A short time later, determined by the delay in the delay circuit 118, the CBSB output goes low and the CBS output goes high. This condition is held until the OZB input again goes high, at which time the CBSB output goes high and the CBS output goes low, followed by the ENB output going low and the EN output going high.

The cross-coupled control of the output transistors to limit rush-through current has been applied across differential push-pull outputs in the previous discussion. This cross-coupled control, however, can also be applied within a single push-pull output stage. When used in a single output stage, the voltage driving the lower output transistor is used to control a current source coupled to the control terminal of the upper output transistor, and similarly, the voltage on the control terminal of the upper output transistor is used to control a current source connected to the control terminal of the lower output transistor. These cross-coupled current sources turn off one of the output transistors when the other output transistor is conducting significant current, thereby preventing excessive rush-through current in the output transistors. This single stage cross-coupling directly limits rush-through current, and thus is effective even at zero output voltage.

Figure 7:
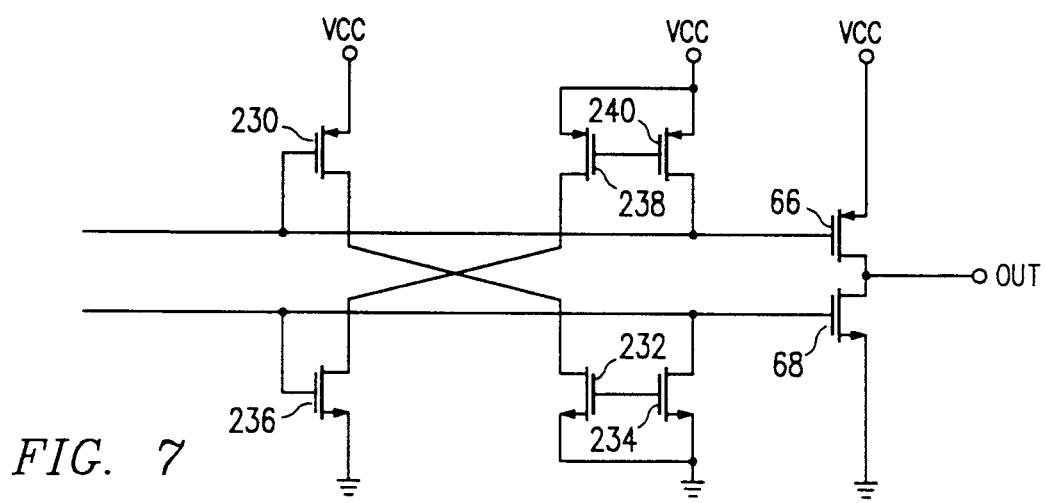
FIG. 7 is a circuit diagram of a cross-coupled single output stage according to the present invention.

FIG. 7 is a circuit diagram of the output transistors of a single ended amplifier with cross-coupled transistor circuitry added to control the rush-through current of the output transistors. The output and cross-coupled transistors 66, 68, 72, and 76 of FIG. 3 can be replaced by the circuitry of FIG. 7. Similarly, the output and cross-coupled transistors 54, 56, 70, and 74 of FIG. 3 can also be replaced with the circuitry shown in FIG. 7. As shown in FIG. 7, the gate of the upper p-channel output transistor 66 is connected to the gate of a p-channel transistor 230, the source of which is connected to VCC and the drain of which is connected to the drain and gate of an n-channel transistor 232. The source of the n-channel transistor 232 is connected to ground. Also connected to the gate of the n-channel transistor 232 is the gate of another n-channel transistor 234, the source of which is connected to ground and the drain of which is connected to the gate of the lower n-channel output transistor 68. The gate of the lower n-channel output transistor 68 is also connected to the gate of an n-channel transistor 236, the source of which is connected to ground and the drain of which is connected to the drain and gate of a p-channel transistor 238. The source of the p-channel transistor 238 is connected to VCC. The gate of the p-channel transistor 238 is also connected to the gate of another p-channel transistor 240, the source of which is connected to VCC, and the drain of which is connected to the gate of the upper p-channel output transistor 66.

In operation, the voltage on the gate of the upper p-channel output transistor 66 is used to control the current through the p-channel transistor 230. (This can be viewed as obtaining a current proportional to the current through the upper p-channel output transistor 66.) This current is mirrored by transistors 232 and 234, which attempt to sink current from the gate of the lower n-channel output transistor 68. In a similar manner, the voltage on the gate of the lower n-channel output transistor 68 is used to control the current through the n-channel transistor 236. (Similarly, this can be viewed as obtaining a current proportional to the current through the lower n-channel output transistor 68.) This current is mirrored by the p-channel transistors 238 and 240, which attempt to source current into the gate of the upper p-channel output transistor 66. When the voltage on the gate of the upper p-channel output transistor 66 is sufficiently below VCC to cause the upper p-channel output transistor 66 to be significantly conductive, the p-channel transistor 230 becomes conductive. This causes the n-channel current mirror, composed of transistors 232 and 234, to try to sink current from the gate node of the lower n-channel output transistor 68, thereby attempting to keep the lower n-channel output transistor 68 from being conductive. However, when the voltage on the gate of the upper p-channel output transistor 66 is high enough to keep the upper p-channel output transistor 66 from being conductive, the p-channel transistor 230 does not conduct current. This causes the n-channel transistors 232 and 234 to sink no current, thus allowing the lower n-channel output transistor 68 to become conductive. In a similar manner, transistors 236, 238, and 240 attempt to keep the upper p-channel output transistor 66 from being conductive when the lower n-channel output transistor 68 is conductive, and allow the upper p-channel output transistor 66 to become conductive when the lower n-channel output transistor 68 is not conductive.

The proportion of output transistor current mirrored by transistors 230, 232, and 234 and transistors 236, 238, and 240 establishes the tradeoff between output deadband and rush-through current. Larger proportions reduce rush-through current near the switch point, but potentially increase output deadband. Although the sources of the p-channel transistors 238 and 240 are shown connected to VCC and the sources of the n-channel transistors 232 and 234 are shown connected to ground, it will be understood by those skilled in the art that other appropriate reference voltages can be used in place of VCC and ground for these connections.

Therefore, there has been described a linear power amplifier which includes circuitry that effectively controls the rush-through current in the push-pull output stages of the amplifier.

Although the invention has been described in part by making detailed reference to a certain specific embodiment, such detail is intended to be and will be understood to be instructional rather than restrictive. It will be appreciated by those skilled in the art that many variations may be made in the structure and operation without departing from the spirit and scope of the invention as disclosed in the teachings contained herein.

What is claimed is:

1. An amplifier output stage having a positive output and a negative output wherein said positive output is driven, at least in part, by a first output transistor coupled between a first reference voltage and said positive output, and said negative output is driven, at least in part, by a second output transistor coupled between said first reference voltage and said negative output, said amplifier output stage comprising:
   (a) a first variable current shunt path coupled to a control terminal of said first output transistor, said first variable current shunt path being responsive to the voltage on a control terminal of said second output transistor such that the amount of current through said first variable current shunt path affects the conductivity of said first output transistor; and
   (b) a second variable current shunt path coupled to said control terminal of said second output transistor, said second variable current shunt path being responsive to the voltage on said control terminal of said first output transistor such that the amount of current through said second variable current shunt path affects the conductivity of said second output transistor.

2. An amplifier output stage as set forth in claim 1 wherein said positive output is also driven by a third output transistor coupled between said positive output and a second reference voltage, and said negative output is also driven by a fourth output transistor coupled between said negative output and said second reference voltage, said amplifier output stage also including:
   (a) a third variable current shunt path coupled to a control terminal of said third output transistor, said third variable current shunt path being responsive to the voltage on a control terminal of said fourth output transistor such that the amount of current through said third variable current shunt path affects the conductivity of said third output transistor; and
   (b) a fourth variable current shunt path coupled to said control terminal of said fourth output transistor, said fourth variable current shunt path being responsive to the voltage on said control terminal of said third output transistor such that the amount of current through said fourth variable current shunt path affects the conductivity of said fourth output transistor.

3. An amplifier output stage having a positive output and a negative output wherein said positive output is driven by a first upper output transistor coupled between a first reference voltage and said positive output and a first lower output transistor coupled between said positive output and a second reference voltage, and said negative output is driven by a second upper output transistor coupled between said first reference voltage and said negative output and a second lower output transistor coupled between said negative output and said second reference voltage, said amplifier output stage further comprising:
   (a) a first cross-coupling transistor coupled between said first reference voltage and a control terminal of said first upper output transistor, a control terminal of said first cross-coupling transistor coupled to a control terminal of said second upper output transistor; and
   (b) a second cross-coupling transistor coupled between said first reference voltage and said control terminal of said second upper output transistor, a control terminal of said second cross-coupling transistor coupled to said control terminal of said first upper output transistor.

4. The amplifier output stage set forth in claim 3 further comprising:
   (a) a third cross-coupling transistor coupled between a control terminal of said first lower output transistor and said second reference voltage, a control terminal of said third cross-coupling transistor coupled to a control terminal of said second lower output transistor; and
   (b) a fourth cross-coupling transistor coupled between said control terminal of said second lower output transistor and said second reference voltage, a control terminal of said fourth cross-coupling transistor coupled to said control terminal of said first lower output transistor.

5. The amplifier output stage set forth in claim 4 wherein said first, second, third, and fourth cross-coupling transistors are MOS transistors.

6. An amplifier having a first output and a second output comprising:
   (a) means for generating a first and a second current signal wherein the differential current of said first and second current signals is controlled, at least in part, by the voltage at a first input;
   (b) a series combination of a third current source and a fourth current source, wherein the current through said third current source has an upper limit proportional to the current through said first current source, and the current through said fourth current source has an upper limit proportional to the current through said second current source;
   (c) a first output transistor coupled between said first output and a first reference voltage and having a control terminal thereof coupled to a node between said third and fourth current sources;

(d) a series combination of a fifth current source and a sixth current source, wherein the current through said fifth current source has an upper limit proportional to the current through said second current source, and the current through said sixth current source has an upper limit proportional to the current through said first current source;

(e) a second output transistor coupled between said second output and said first reference voltage and having a control terminal thereof coupled to a node between said fifth and sixth current sources;

(f) a first current shunt means coupled to said control terminal of said first output transistor, wherein the current through said first current shunt means is responsive to the voltage on said control terminal of said second output transistor; and (g) a second current shunt means coupled to said control terminal of said second output transistor, wherein the current through said second current shunt means is responsive to the voltage on said control terminal of said first output transistor.

7. The amplifier as set forth in claim 6 wherein said first current shunt means comprises a transistor coupled between said control terminal of said first output transistor and said first reference voltage, and having a control terminal thereof coupled to said control terminal of said second output transistor, and said second current shunt means comprises a transistor coupled between said control terminal of said second output transistor and said first reference voltage, and having a control terminal thereof coupled to said control terminal of said first output transistor.

8. The amplifier as set forth in claim 6 further including:

(a) a series combination of a seventh current source and an eighth current source, wherein the current through said seventh current source has an upper limit proportional to the current through said first current source, and the current through said eighth current source has an upper limit proportional to the current through said second current source;

(b) a third output transistor coupled between said first output and a second reference voltage and having a control terminal thereof coupled to a node between said seventh and eighth current sources;

(c) a series combination of a ninth current source and a tenth current source, wherein the current through said ninth current source has an upper limit proportional to the current through said second current source, and the current through said tenth current source has an upper limit proportional to the current through said first current source;

(d) a fourth output transistor coupled between said second output and said second reference voltage and having a control terminal thereof coupled to a node between said ninth and tenth current sources;

(e) a third current shunt means coupled to said control terminal of said third output transistor, wherein the current through said third current shunt means is responsive to the voltage on said control terminal of said fourth output transistor; and (f) a fourth current shunt means coupled to said control terminal of said fourth output transistor, wherein the current through said fourth current shunt means is responsive to the voltage on said control terminal of said third output transistor.

9. The amplifier as set forth in claim 8 wherein said third current shunt means comprises a transistor coupled between said second reference voltage and said control terminal of said third output transistor, and having a control terminal thereof coupled to said control terminal of said fourth output transistor, and said fourth current shunt means comprises a transistor coupled between said second reference voltage and said control terminal of said fourth output transistor, and having a control terminal thereof coupled to said control terminal of said third output transistor.

10. The amplifier as set forth in claim 6 further including circuitry coupled between said node between said third and fourth current sources and said control terminal of said first output transistor, wherein said circuitry, in response to a control signal, isolates said node between said third and fourth current sources from said control terminal of said first output transistor, and couples said control terminal of said first output transistor to a voltage to render said first output transistor nonconductive.

11. The amplifier as set forth in claim 6 wherein said differential current of said first current source and said second current source is proportional to the differential voltage on said first input and a second input.

12. An amplifier comprising:

(a) an input stage for receiving a time varying input signal;

(b) at least one output transistor couples between a reference voltage and an output terminal, said output transistor having a control terminal coupled to said input stage; and (c) circuitry coupled between said input stage and said control terminal of said at least one output transistor which, in response to a control signal, isolates said input stage from said control terminal of said at least one output transistor, and applies a voltage to said control terminal of said at least one output transistor to render said at least one output transistor nonconductive.

13. The amplifier set forth in claim 12 wherein said voltage applied to said control terminal of said at least one output transistor when said control terminal of said at least one output transistor is isolated from said input stage is such that the current through said output transistor decreases at a predetermined rate.

14. A simplifier output stage comprising:

(a) a first output transistor coupled between a first reference voltage and an output terminal, and a second output transistor coupled between a second reference voltage and said output terminal; and (b) a first variable current shunt path coupled between said first reference voltage and a control terminal of said first output transistor, said first variable current shunt path being responsive to the voltage on a control terminal of said second output transistor such that the amount of current through said first variable current shunt path affects the conductivity of said first output transistor.

15. The amplifier output stage set forth in claim 14 further including a second variable current shunt path coupled between said second reference voltage and said control terminal of said second output transistor, said second variable current shunt path being responsive to the voltage on said control terminal of said first output transistor such that the amount of current through said second variable current shunt path affects the conductivity of said second output transistor.

16. An amplifier output stage having a first output transistor coupled between a first reference voltage and an output, and a second output transistor coupled between said output and a second reference voltage, said amplifier output stage further comprising:
   (a) a first transistor coupled between said first reference voltage and a control terminal of said first output transistor;
   (b) a second transistor coupled between said first reference voltage and a first node, a control terminal of said first transistor coupled to a control terminal of said second transistor and also to said first node; and
   (c) a third transistor coupled between said first node and said second reference voltage, a control terminal of said third transistor coupled to a control terminal of said second output transistor, the conductivity of said third transistor being responsive to the voltage on said control terminal of said second output transistor.

17. The amplifier output stage set forth in claim 16 further comprising:
   (a) a fourth transistor coupled between said control terminal of said second output transistor and said second reference voltage;
   (b) a fifth transistor coupled between said second reference voltage and a second node, a control terminal of said fourth transistor coupled to a control terminal of said fifth transistor and also to said second node; and
   (c) a sixth transistor coupled between said second node and said first reference voltage, a control terminal of said sixth transistor coupled to said control terminal of said first output transistor, the conductivity of said sixth transistor being responsive to the voltage on said control terminal of said first output transistor.

18. The amplifier output stage set forth in claim 16 wherein said control terminal of said second transistor is connected directly to said control terminal of said second output transistor.

19. The amplifier output stage set forth in claim 17 wherein said control terminal of said sixth transistor is connected directly to said control terminal of said first output transistor.

* * * * *